United States Patent [19]
Morimoto

[11] Patent Number: 4,486,499
[45] Date of Patent: Dec. 4, 1984

[54] ELECTROLUMINESCENT DEVICE

[75] Inventor: Kiyoshi Morimoto, Mobara, Japan

[73] Assignee: Futaba Denshi Kogyo Kabushiki Kaisha, Mobara, Japan

[21] Appl. No.: 270,884

[22] Filed: Jun. 5, 1981

[30] Foreign Application Priority Data

Jun. 13, 1980 [JP] Japan .................................. 55-78952

[51] Int. Cl.³ ........................ H05B 33/14; B32B 17/06
[52] U.S. Cl. ...................................... 428/336; 313/499;
313/503; 350/357; 428/432; 428/471; 428/472;
428/690; 428/698; 428/699; 428/701; 428/917
[58] Field of Search ............... 428/917, 701, 699, 698,
428/690, 432, 336, 471, 472; 427/66; 350/357;
313/503, 499

[56] References Cited

U.S. PATENT DOCUMENTS

| 3,313,652 | 4/1967 | Blazek | 428/917 |
| 3,650,824 | 3/1972 | Szepesl | 428/917 |
| 3,729,342 | 4/1973 | Velde | 428/917 |
| 4,137,481 | 1/1979 | Hilsum | 313/503 |

FOREIGN PATENT DOCUMENTS 1543233  3/1979  United Kingdom ............... 428/917

Primary Examiner—Ellis P. Robinson
Attorney, Agent, or Firm—Oblon, Fisher, Spivak, McClelland & Maier

[57] ABSTRACT

The electroluminescent device comprises an electroluminescent layer and means for exciting the electroluminescent layer to luminescence with an electric field. The electroluminescent layer comprises a phosphor layer having characteristics of a n-type semiconductor and a semiconductor layer consisting of copper sulfide having characteristics of a p-type semiconductor.

5 Claims, 6 Drawing Figures

ELECTROLUMINESCENT DEVICE

BACKGROUND OF THE INVENTION

1. Field of the Invention:

This invention relates to a novel electroluminescent device.

2. Description of the Prior Art:

Electroluminescent devices utilize a substance which emits light under the influence of an electric field. Such a substance can be a powdered electroluminescent phosphor which is dispersed into a dielectric material having high dielectric constant or laminated in the form of thick layer between suitable electrodes. In an alternative form of the electroluminescent device, the electroluminescent phosphor comprises a thin film layer which is formed by vacuum evaporation. These electroluminescent devices are energized either by an alternating or direct current power source.

FIG. 1 schematically illustrates a conventional electroluminescent device dispersing a powdered electroluminescent phosphor into the cell which is driven by a dc voltage. The electroluminescent device comprises a transparent glass substrate 1 having a transparent conductive coating 2 of $In_2O_3$ or $SnO_2$ thereon, a sputtered electroluminescent layer 3 thereon, and an evaporated metal electrode 4 upon the electroluminescent layer 3. The electroluminescent layer 3 used in the cell is processed so as to permit some degree of dc current to pass therethrough. For instance, when using a ZnS:Mn phosphor, it is subjected to have the phosphor particles 5 coated with $Cu_xS$ ($1 \leq x \leq 2$) layers 6 by immersing the phosphor particles 5 in copper sulphate or copper acetate solution as shown in FIG. 2. In the electroluminescent device shown in FIG. 1, the transparent conductive coating 2 which acts as a positive electrode and the metal electrode 4 which acts as a negative electrode are connected to a dc source which provides the power for operatng the electroluminescent device. When the power is turned on, $Cu^+$ ions move from the Cuxs layers 6 to the inside of the phosphor particles 5 under the influence of an electric field as shown in FIG. 2, and an area without having the $Cu_xS$ layers 6 is formed between the phosphor particles 5 and the transparent conductive coating 2. When a high electric field is applied to this area which is high in electric resistance, the electroluminescent layers 3 can emit light.

However, in the electroluminescent device shown in FIG. 1, the $Cu^+$ ions in the Cuxs layers continue to diffuse in the phosphor particles 5 in the electroluminescent layer 3 contacting to the transparent conductive coating 2 under the influence of the electric field between the transparent conductive coating 2 and the metal electrode 4. As a result, the ZnS:Mn phosphor having characteristics of a n-type semiconductor undergoes doping compensation to be injected by the monovalent Cu and is converted into a phosphor having characteristics similar to those of an intrinsic semiconductor. Accordingly, when the dc voltage is applied to the resultant electroluminescent layer 3, a dim and unstable electroluminescence is observed, because the layer is high in electrical resistance and relatively small currents could pass through the layer.

In an electroluminescent device utilizing a thin electroluminescent layer, the luminescent layer is extremely thin which is about 10 $\mu$m thick and is high in electric resistance. Thus, it cannot emit light of sufficient brightness unless a higher voltage is applied to the luminescent layer. Furthermore, the operating life of the device is relatively short, because pinholes are liable to be formed in the luminescent layer which cause dielectric breakdown.

In order to eliminate these disadvantages explained hereinabove, an electroluminescent device utilizing laminations of a thin film luminescent layer and a dielectric layer which is operated by an ac source has been proposed and put to practical use. However, this electroluminescent device is difficult to control, because it requires a high voltage of approximately 200 V to 400 V and complicated driving circuits for operating the device. Because of these disadvantages, the application of the electroluminescent device is limited in a certain field, and it has not been widely used as a display device, although it is highly expected its utility as a planar light emitter or a medium or large-sized planar display device.

SUMMARY OF THE INVENTION

Accordingly, it is an object of the present invention to provide an electroluminescent device which can emit electroluminescence of higher brightness and significantly increase in the operating life.

It is further object of the present invention to provide an electroluminescent device which is stable in its operation and driven by a low voltage dc source.

According to the present invention, the foregoing and other objects are attained by providing an electroluminescent device which comprises a transparent substrate having a transparent electrode thereon, a phosphor layer having characteristics of a n-type semiconductor deposited thereon, a semiconductor layer consisting of copper sulfide having characteristics of a p-type semiconductor deposited on the phosphor layer, and a back electrode deposited the semiconductor layer.

BRIEF DESCRIPTION OF THE DRAWINGS

Other objects and many of the attendant advantages of this invention will be readily appreciated as the same becomes better understood by reference to the following detailed description when considered in connection with the accompanying drawings, in which like reference characters designate the same or similar parts throughout the figures thereof wherein.

DESCRIPTION OF THE PREFERRED EMBODIMENTS

An electroluminescent device according to the present invention will now be described in connection with the accompanying drawings.

Figure 1:
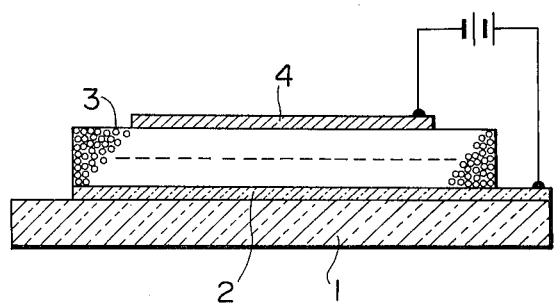
FIG. 1 is a cross sectional view of an electroluminescent device of the prior art.
Figure 2:
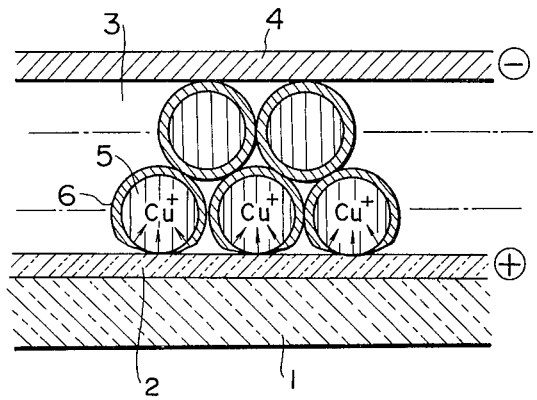
FIG. 2 is an enlarged fragmentary cross sectional view of the electroluminescent device shown in FIG. 1.
Figure 3:
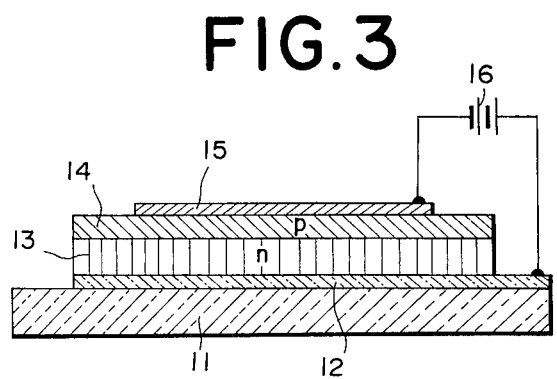
FIG. 3 is a cross sectional view of an electroluminescent device according to an embodiment of the present invention.

FIG. 3 illustrates a basic structure of an electroluminescent device according to the present invention. The electroluminescent device comprises a transparent glass substrate 11 having a transparent electrode 12 of predetermined shape which is prepared by $SnO_2$, $In_2O_3$-$SnO_2$, $SnO_2$-$Sb_2O_3$ or the like and deposited thereon by vacuum deposition, sputtering or spraying, a phosphor layer 13 having characteristics of a n-type semiconductor deposited on the transparent electrode 12, a semiconductor layer 14 having characteristics of a p-type semiconductor deposited on the phosphor layer 13, and an evaporated aluminum back electrode 15 deposited on the semiconductor layer 14.

The phosphor layer 13 consists of a phosphor which is subjected to be low in electric resistance doped by aluminum which acts as a donor in the n-type semiconductor in a high concentration ($10^{-4}$ to $5 \times 10^{-2}$ gram atom/gram mole of phosphor materials) and is deposited by vacuum evaporation, sputtering, ion plating, reactive sputtering, reactive ion plating or the like. The phosphor containing one or more phosphors selected from the group consisting of ZnS:Mn, Al; ZnS:Ag, Al; ZnS:Cu, Al; ZnS: $REF_3$, Al; ZnCdS:Ag, Al; ZnCdS:Cu, Al; ZnCdS:Mn, Al; and ZnCdS:$REF_3$, Al (wherein RE represents a rare earth element) can be used in forming the phosphor layer 13. In a possible alternative embodiment, the phosphor layer 13 may be formed of laminations of two or more phosphor layers, each of which consists of the phosphor described hereinabove. When depositing the phosphor layer 13 by vacuum deposition, it is effected by using the phosphor which is prepared to premix the activator element, such as, Mn, Ag, Cu, Au, RE acting as luminescent centers in the host fluorescent material and the co-activator element, such as, Al, Ga, In, Cl, Br, I acting as dopant in the host fluorescent material with the host material. The phosphor layer 13 can be formed by multiple source vacuum deposition which makes use of separate crucibles for containing each of the component elements of the phosphor. The phosphor layer 13 deposited on the transparent electrode 12 by the process explained hereinabove may be heat-treated at a temperature of 400° C. to 1,000° C., preferably 500° C. to 600° C., in an inert gas so that each of the elements added to the host fluorescent material becomes a substitutional atom. The resultant phosphor layer 13 is from about 0.1 to 10 μm thick, preferably about 0.3 to 3 μm thick.

The semiconductor layer 14 having the characteristics of the p-type semiconductor deposited on the phosphor layer 13 may be formed of a $Cu_xS$ layer which exhibits characteristics of the p-type semiconductor. The $Cu_xS$ layer is formed in such a manner that the substrate 11 having the transparent electrode 12 and the phosphor layer 13 deposited thereon is immersed in a copper sulfate solution, a copper acetate solution, or copper oxalate solution and heated at an appropriate temperature so that the $Cu_xS$ may precipitate on the surface of the phosphor layer 13 by the difference in ionization tendency. In this instance, there is no possibility of intruding $Cu^+$ ions into the junction between the transparent electrode 12 and the phosphor layer 13 which causes deterioration of the electroluminescent layer and instability of the operation in the electroluminescent device even though the substrate 11 is immersed in the solution distributing Cu, because the phosphor layer 13 is firmly deposited on the transparent electrode 12 as a thin film. Accordingly, the resultant structure is effective for keeping the long operating life of the electroluminescent layer and the operating stability of the electroluminescent device. The semiconductor layer 14 may be a semiconductor, such as, Ge, in which an acceptor impurity is doped. In this instance, the semiconductor layer is deposited by vacuum deposition, sputtering, or ion plating in the same manner as the formation of the phosphor layer 13.

The electroluminescent device of the present invention is constructed as explained hereinabove, and the transparent electrode 12 which acts as the positive electrode and the back electrode 15 which acts as the negative electrode are connected to a dc source 16 which provides the power for operating the electroluminescent device as shown in FIG. 3. When the power is turned on, a p-n junction formed at the barrier layer of the copper sulfide semiconductor layer 14 having the characteristics of the p-type semiconductor and the phosphor layer 13 having the characteristics of the n-type semiconductor is biased in the reverse direction, and a high electric field is formed at the p-n junction. The phosphor layer 13 exhibits the characteristics of the n-type semiconductor and is heavily doped with the donor impurity, such as, Al. Thus, the voltage does not drop significantly in the phosphor layer 13, and the electric field provided by the dc source 16 is mainly applied to the p-n junction. As a result, electrons existing in the vicinity of the p-n junction or moving from the p-type semiconductor layer 14 by a tunnel effect are accelerated by the high electric field and impinged upon the luminescent centers of the phosphor layer 13, thereby exciting the phosphor layer 13 to emit light. In the electroluminescent device of the present invention, the impurity of $Cu^+$ ions which compensates with the donor impurity in the n-type semiconductor does not exist in the phosphor layer 13 on the positive potential surface thereof. Thus, the luminance brightness does not decrease due to the diffusion of the $Cu^+$ ions, and it is possible to attain the remarkable improvements in the operating life and the operating stability of the device. Furthermore, the brightness can be significantly increased, because the phosphor layer 13 is subjected to be low in electric resistance which permits the potential applied across the transparent electrode 12 and the back electrode 15 to pass through the phosphor layer 13 without significant voltage drop and to apply to the p-n junction at the high voltage, and the p-n junction is reversely biased.

It is to be understood that the electroluminescent device shown in FIG. 3 is the basic structure of the present invention and can be modified in various ways. For instance, each of the electroluminescent elements may be sealed by coating with a resin which is applied from the surface of the back electrode 15. In an alternating arrangement, a lid may be provided to enclose each of the electroluminescent elements in a space which is evacuated in vacuum or filled with an inert gas or silicone oil. The application of the resin coating or the provision of the lid makes it possible to provide the highly reliable electroluminescent device which is improved in its mechanical strength and protected against moisture.

Figure 4:
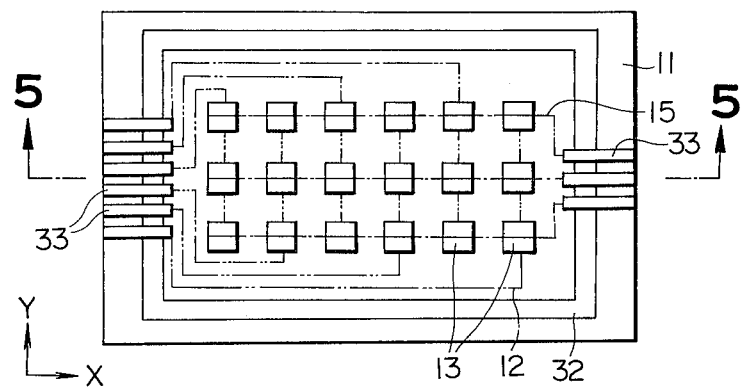
FIG. 4 is a plan view of an electroluminescent device according to another embodiment of the present invention.

It is to be understood that the electroluminescent device of the present invention is adapted for use not only as light emitters but also as various display devices. For instance, when the electroluminescence device shown in FIG. 3 is arranged as shown in FIG. 4 and the transparent electrode 12 and the back electrode 15 of each electroluminescent device are connected in the form of matrix, it is possible to provide dot-matrix letter or pattern display devices or planar display devices substituted for a cathode-ray tube. In the electroluminescent panel shown in FIG. 4, a plurality of the electroluminescent devices can be arranged on a single substrate to be separated by an insulating layer disposed between each of the electroluminescent devices for assuring optical separation of each luminescent portion so as to make the display easy to observe and for facilitating the support of the phosphor layer and the back electrode. The structure of the electroluminescent panel will now be described in detail hereinafter in connection with FIGS. 4 and 5.

Figure 5:
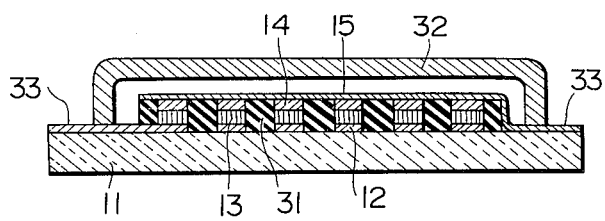
FIG. 5 is a cross sectional view of the electroluminescent device taken along the line 5—5 of FIG. 4.
Figure 6:
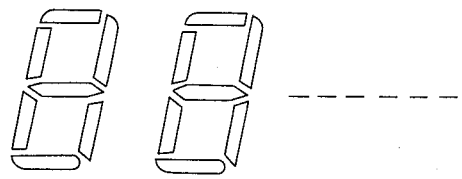
FIG. 6 is a schematic illustration of display pattern used in an embodiment of electroluminescent device according to the present invention.

FIGS. 4 and 5 are similar in strucutre, and similar reference numerals are used for similar structures, to the electroluminescent device of FIG. 3 except that an insulating layer 31 is interposed between the phosphor layer 13 and the semiconductor layer 14. The electroluminescent panel shown in FIGS. 4 and 5 is a dot matrix display device which comprises the substrate 11 having the transparent strip electrodes 12 deposited on the substrate in the direction of the Y axis, the dot-shaped phosphor layer 13 deposited on the electrode 12, the dot-shaped semiconductor layers 14 deposited on the phosphor layer 13, the strip back electrodes 15 deposited on the semiconductor layers 14 in the direction of the X axis transversing the transparent electrodes 12 at a right angle, and the insulating layer 31 interposed between the phosphor layers 13 and the semiconductor layers 14. The insulating layer 31 may be prepared in such a manner that a homogeneous mixture of powdered glass and any suitable pigment which is processed like a paste by adding solvent and binder is deposited on the substrate 11 by screen printing and then it is baked. The firing of the insulating layer 31 may be conducted along with the heat treating process of the phosphor layers 13. The functional elements of the display device thus formed is covered with a lid 32 as shown in FIG. 5 and the inside space is evacuated in vacuum or filled with an inert gas or silicone oil. The transparent electrodes 12 and the back electrodes 15 are provided with terminal contact members 33 made of Al, Au, Ag or the like to be connected to outside circuits. In the electroluminescent panel of the present invention, the transparent electrodes 12, the phosphor layers 13, the semiconductor layers 14, or the back electrode 15 may be subdivided into a plurality of discrete sections in the shape of the block letter 8 as shown in FIG. 6 or a plurality of linearly arranged dotted sections, thereby to produce the desired luminous pattern from the display pannel, such as, for example, a single or multi-digit numeral display or a bar graphical analog display.

As explained hereinabove, the electroluminescent device of the present invention comprises the transparent glass substrate, the transparent electrode deposited on the transparent glass substrate, the phosphor layer having the characteristics of the n-type semiconductor deposited on the transparent electrode, the copper sulfide semiconductor layer having the characteristics of the p-type semiconductor deposited on the phosphor layer, and the back electrode deposited on the copper sulfide semiconductor layer.

According to the electroluminescent device of the present invention, the high electric field can be applied to the phosphor layer 13 by reversely biasing the p-n junction, thereby permitting the luminescent centers of the phosphor layer to be effectively excited by the electrons impinging upon the luminescent centers of the phosphor layer, which results in significant increase in the brightness. Furthermore, the diffusion of the Cu ions in the phosphor which is being excited or the introduction of other impurities into the phosphor which deteriorate the emission of the electroluminescence can be eliminated, because the phosphor layer is directly deposited on the positive electrode as the thin film. Accordingly, the electroluminescent device of the present invention can be operated in stable manner for a long period of time, and is useful for the electroluminescent device driven by the low voltage dc source.

Obviously, many modifications and variation of the present invention are possible in the light of the above teachings. It is therefore to be understood that within the scope of the appended claims, the invention may be practiced otherwise than as specifically described.

What is claimed as new and desired to be secured by Letters Patent of the United States is:

1. An electroluminescent device comprising:
   a transparent glass substrate;
   a transparent electrode deposited on said transparent glass substrate;
   a phosphor layer about 0.1 to about 10 $\mu$m thick having characteristics of an n-type semiconductor deposited on said transparent electrode, said layer comprising an n-type dopant in sufficient concentrations to provide said n-type characteristic;
   a semiconductor layer consisting of copper sulfide having characteristics of a p-type semiconductor deposited on said phosphor layer; and
   a back electrode deposited on said semiconductor layer.

2. The electroluminescent device defined in claim 1 wherein said phosphor layer comprises a phosphor which is processed to be low in electric resistance.

3. The electroluminescent device defined in claim 1 or 2 wherein said phosphor layer comprises one or more phosphors in which impurities acting as a donor within the host fluorescent material are heavily doped.

4. An electroluminescent device according to claim 1 or 2 wherein said device is driven by a low voltage DC source.

5. An electroluminescent device according to claim 4 wherein said device is stable in operation.

* * * * *